(12) United States Patent
Lien

(10) Patent No.: US 6,639,414 B2
(45) Date of Patent: Oct. 28, 2003

(54) CIRCUIT FOR MEASURING CHANGES IN CAPACITOR GAP USING A SWITCHED CAPACITOR TECHNIQUE

(75) Inventor: Wee Liang Lien, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 10/024,750

(22) Filed: Dec. 19, 2001

(65) Prior Publication Data

US 2003/0057967 A1 Mar. 27, 2003

(30) Foreign Application Priority Data

Sep. 24, 2001 (SG) ........................................ 200105786-8

(51) Int. Cl.[7] .......................... G01R 27/26; G01R 27/28
(52) U.S. Cl. ........................ 324/658; 324/672; 324/679; 324/709; 324/683
(58) Field of Search ............................... 324/655, 658, 324/666, 667, 672, 673, 677, 679, 678, 709, 683

(56) References Cited

U.S. PATENT DOCUMENTS

| | | | | |
|---|---|---|---|---|
| 5,659,254 A | * | 8/1997 | Matsumoto et al. | 324/678 |
| 6,278,283 B1 | * | 8/2001 | Tsugai | 324/678 |
| 6,377,056 B1 | * | 4/2002 | Hanzawa et al. | 324/678 |
| 6,486,656 B1 | * | 11/2002 | Schroeder | 324/207.21 |

* cited by examiner

Primary Examiner—N. Le
Assistant Examiner—Donald M Lair
(74) Attorney, Agent, or Firm—Perkins Coie LLP

(57) ABSTRACT

Disclosed is a single-stage, switched capacitor circuit for measuring changes in a variable by measuring changes in a capacitor gap. The change in the capacitor gap corresponds directly to a change in a measurable variable, such as pressure and acceleration, and thus a change in voltage. The circuit includes at least one reference capacitor, a sensor capacitor, a plurality of switches responsive to a timing device, and a device for generating substantially constant reference voltages. The sensor circuit does not result in a DC offset value, but results in the AC component of the voltage being directly proportional to the change in the variable through a substantially constant voltage is supplied to a node near the sensor capacitance. The circuit may be trimmed using a digital to analog converter and/or capacitors coupled in parallel.

23 Claims, 11 Drawing Sheets

CIRCUIT FOR MEASURING CHANGES IN CAPACITOR GAP USING A SWITCHED CAPACITOR TECHNIQUE

CROSS-REFERENCE TO RELATED APPLICATIONS

Not applicable.

STATEMENT REGARDING FEDERALLY SPONSORED RESEARCH

Not applicable.

FIELD OF THE INVENTION

The present invention relates generally to sensors, and more particularly to measuring changes in a variable that can be related to capacitance using a switched capacitor technique.

BACKGROUND OF THE INVENTION

Capacitive sensors may be used to convert variations in many measurable variables, such as acceleration and pressure, to variations in capacitance. Another conversion takes place in that the variations in capacitance are then converted to observable variations in voltage. In some implementations of the prior art, an output voltage is directly proportional to gap changes in the capacitor. Prior art examples of such implementations are described by Y. E. Park and K. D. Wise in a publication entitled "An MOS Switched-Capacitor Readout Amplifier for Capacitive Pressure Sensors" for the IEEE Custom IC Conference of 1983 at pages 380–384. A second such implementation is described by E. D. Joseph, et al. in a publication entitled "Design and Noise Analysis of an Automotive Accelerometer" for the IEEE ISCAS in 1996. A third such implementation is described by B. E. Boser in a publication entitled "Electronics for Micromachined Inertial Sensors" for the International Conference on Solid-State Sensors and Actuators in 1997 at pages 1169–1172. A shortcoming is evident in these prior art implementations in that it appears that the output voltage is directly proportional to gap changes in the capacitor only when there are small variations in gap distance.

Another example of such a prior art implementation is shown in U.S. Pat. No. 4,656,871 entitled "Capacitor Sensor and Method" issued on Apr. 14, 1987 to Motorola, Inc. (hereinafter "the '871 Patent"). Switched capacitors are used in this invention to measure changes in a variable. The invention described in the '871 Patent is directed to a method for converting a measured variable to an electrical output signal. The inventor performs this feat by placing sensor capacitors between the output and inverting input terminal of the operational amplifier, thus placing the sensor capacitor at the feedback loop of the operational amplifier. A difference amplifier is placed at the output stage. However, the invention described in the '871 Patent results in DC offset voltage that must be corrected. Thus, an additional step of correcting the voltage, i.e., the difference amplifier, is necessary. This circuitry results in a more expensive, complicated product to measure the change in variable.

FIG. 1 is a schematic diagram of a prior art capacitive sensor circuit. Disclosed is a switched capacitor method that places the sensor capacitor at the feedback loop of the operational amplifier. This prior art capacitive sensor is used to convert variations in a measured variable to variations in capacitance. This variation in capacitance is then converted to a variation in an electrical output signal. The prior art implementation results in a constant DC offset voltage that needs to be corrected through a difference amplifier at the output stage.

There is a need for a circuit for measuring changes in capacitor gap using a switched capacitor technique that measures changes in a measurable variable such as pressure for larger variations in capacitor gap distances. There is also a need for a circuit for measuring changes in capacitor gap using a switched capacitor technique that does not result in a constant DC offset voltage that needs to be corrected through a difference amplifier at the output stage.

SUMMARY OF THE INVENTION

The present invention solves the needs addressed above. The present invention provides a circuit for measuring changes in a capacitor gap, in terms of voltage, using a switched capacitor technique. The change in the capacitor gap corresponds directly to a change in a measurable variable, such as pressure and acceleration. The change in variable also corresponds to a change in voltage. It is an object of the present invention to provide a circuit for measuring changes in a capacitor gap, and thus voltage, using a switched capacitor technique. The sensor includes circuitry that does not result in a DC offset value, but results in the AC component of the voltage being directly proportional to the change in the variable. A substantially constant voltage is supplied to a node near the sensor capacitance, thereby eliminating the DC offset voltage.

In a first embodiment of the present invention, a sensing circuit measures changes in a measurable variable by correlating these changes to voltage changes. This circuit includes an operational amplifier that can be electrically coupled to various supply voltages via five switches that are controlled by a two-phase nonoverlapping clock. During one phase, a first group of switches close; during a second phase, a second set of switches close. Depending on the phase of the clock, and thus the switches that are closed, three substantially constant DC supply voltages are supplied to various points on the sensing circuit through the connections formed by the switches. The various voltages can be generated with a voltage divider and a unity gain buffer. One supply voltage is applied to a node on the circuit and automatically cancels DC offset voltage. Through a unique relationship between the various supply voltages and the value of a CMOS reference capacitor, the output voltage can be made directly proportional to a change in gap for a sensor capacitor.

In another embodiment of the present invention, the circuit is simplified in that the supply voltages are set to substantially equal values, but some of the supply voltages are negative while the others are positive. This embodiment includes an operational amplifier, two groups of switches closed in different phases by a two-phase nonoverlapping clock, substantially constant supply voltages, a reference capacitor and a sensor capacitor.

In yet another embodiment of the present invention, an operational amplifier is coupled to two capacitors other than the reference capacitor, and one of the capacitors (including a sensor capacitor) is coupled to the inverting input of the operational amplifier at different phases of the clock.

In yet another embodiment of the present invention, a fully differential implementation of the circuit is shown. This embodiment contains additional switches and additional capacitors than other embodiments of the invention. In this embodiment, the capacitance of two reference capacitors are correlated to the change in gap of two sensor capacitors. In this embodiment, a differential output voltage is obtained from the outputs of the operational amplifier. The two sensor capacitors of this embodiment are electrically insulated from each other; but their common plate is moveable in accordance with gap increasing in one of the capacitors and decreasing in the other.

It is an object of the present invention to provide for a circuit that correlates changes in capacitance to changes in a measurable variable for larger variations in capacitor gap distances. Moreover, it is an object of the present invention to provide for a circuit that does not result in a constant DC offset voltage that needs to be corrected. Since there is no DC offset voltage, the dynamic range of the circuit is improved.

BRIEF DESCRIPTION OF THE DRAWINGS

These and other objects, features, and characteristics of the present invention will become apparent to one skilled in the art from a close study of the following detailed description in conjunction with the accompanying drawings and appended claims, all of which form a part of this application. In the drawings:

DETAILED DESCRIPTION OF THE PRESENTLY PREFERRED EXEMPLARY EMBODIMENTS

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds, are therefore intended to be embraced by the appended claims.

Figure 1:
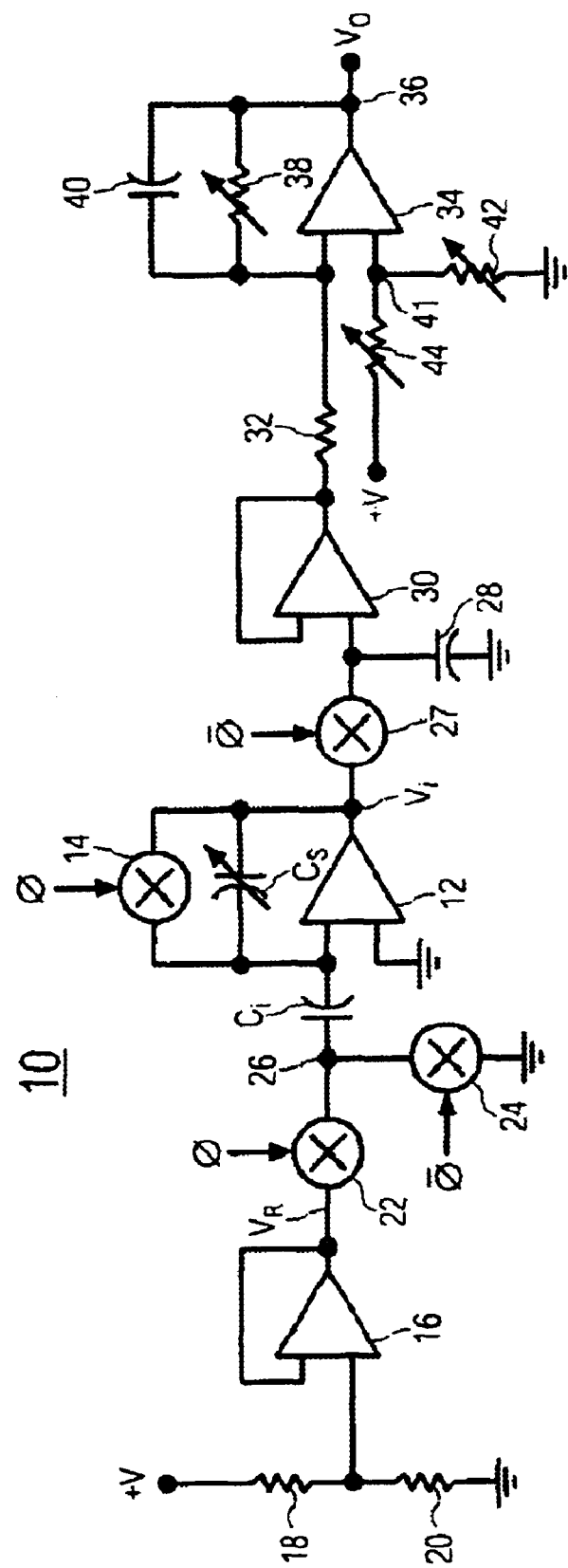
FIG. 1 is a schematic circuit diagram of the prior art.
Figure 2A:
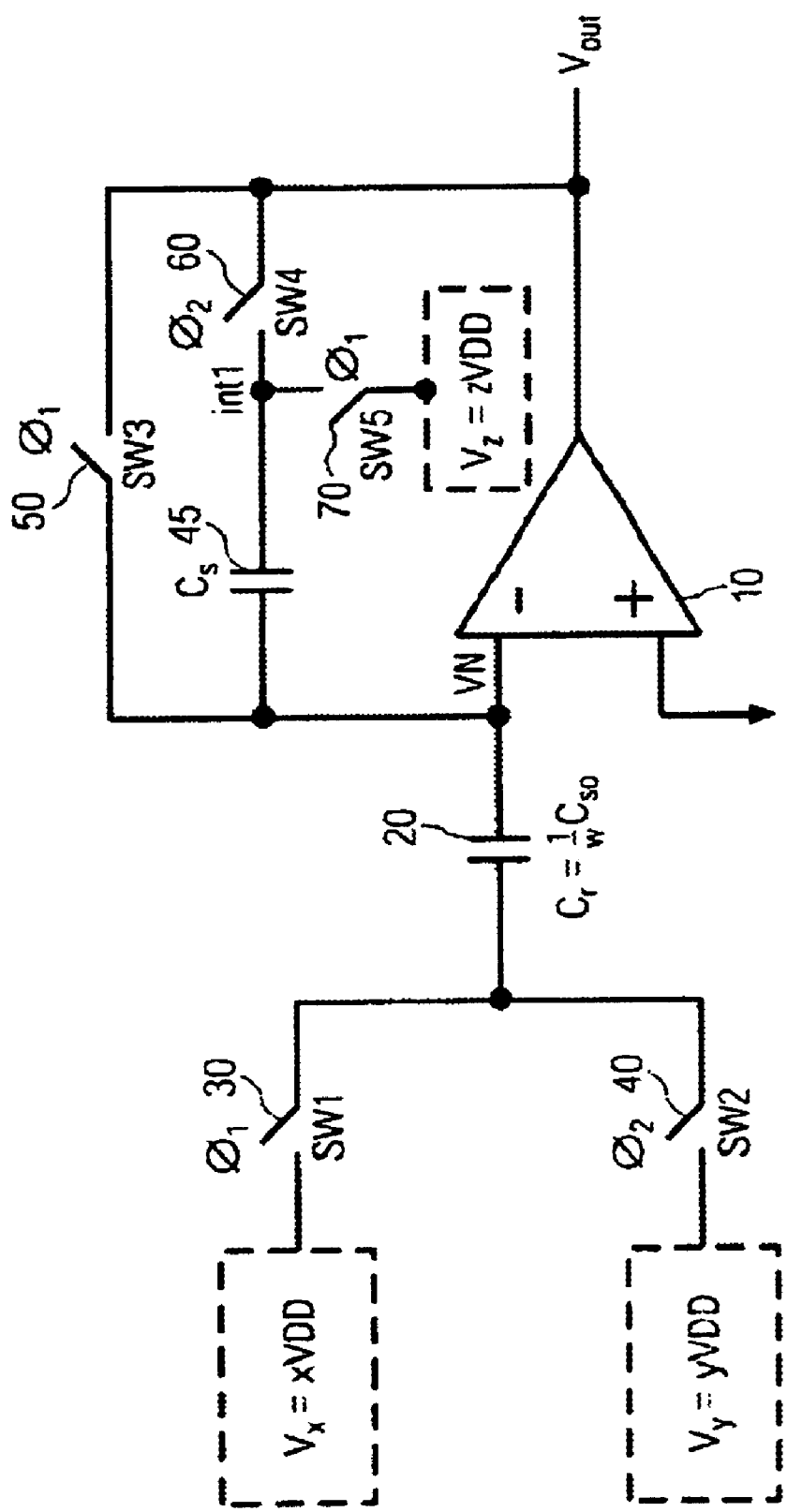
FIG. 2A is a schematic diagram of a capacitive sensor circuit in accordance with one embodiment of the present invention.

Referring now to FIG. 2A, disclosed is a schematic diagram of a capacitive sensor circuit in accordance with one embodiment of the present invention. The circuit is used to convert a measurable input variable to voltage (indicated as Vout). The input variable may be acceleration, pressure or any other variable that can be shown as a change in capacitance, i.e., any variable that can cause the plates of a capacitor to move. An operational amplifier 10 is shown with an inverting input, a non-inverting input and an output. The voltage output from the operational amplifier 10 is referenced as Vout. The non-inverting input is coupled to ground. The inverting input is coupled to the capacitance $C_{so}$ 45 and to an input capacitor $C_r$ 20. $C_{so}$ represents the capacitance value prior to a change in gap. After a change in gap, the capacitance value for the sensor capacitor is $C_s$ 45. $C_s$ 45 can be a micromachined capacitive sensor. Changes in the measured variable result in changes to the capacitance $C_s$ 45.

Five transistor switches are shown in various locations on the circuit. Depending upon the different voltage levels that the switch undergoes during circuit operation, the switches can be either NMOS, pMOS or parallel combination of both. The switches include a first switch 30, a second switch 40, a third switch 50, a fourth switch 60 and a fifth switch 70. The location of all the switches will be described in greater detail hereinbelow. The switches 30, 50 and 70 represent the first group of switches. Switches 40 and 60 represent the second group of switches. These switches are controlled by a two-phase nonoverlapping clock. The first group of switches, i.e., the first switch 30, the third switch 50 and the fifth switch 70, are closed when the clock signal .PHI.1 goes high. When first switch 30 closes, substantially constant voltage $V_x$ is supplied to reference capacitor $C_r$ 20. When the clock signal is high, fifth switch 70 closes such that substantially constant reference voltage $V_z$ is supplied to an internal node (intl) thereby automatically canceling DC offset voltage that would result to the circuit. Switch 50 closes such that a loop is formed from the inverting input of the operational amplifier 10 to the output of operational amplifier 10.

When the clock signal .PHI.2 goes high, the second switch 40 and the fourth switch 60 are closed. When the second switch 40 closes, capacitor $C_r$ 20 is coupled to substantially constant reference voltage $V_y$. When the fourth switch 60 closes, capacitor $C_s$ 45 is coupled between the inverting input of operational amplifier 10 and the output of operational amplifier 10.

In both phases of the clock, capacitor $C_s$ 45, in addition to being operatively coupled to capacitor $C_r$ 20, is also operatively coupled in series to an internal node ($int_1$). $C_r$ 20 is also, at both phases of the clock, operatively coupled between the inverting input of operational amplifier 10 and the output of operational amplifier 10.

Figure 2B:
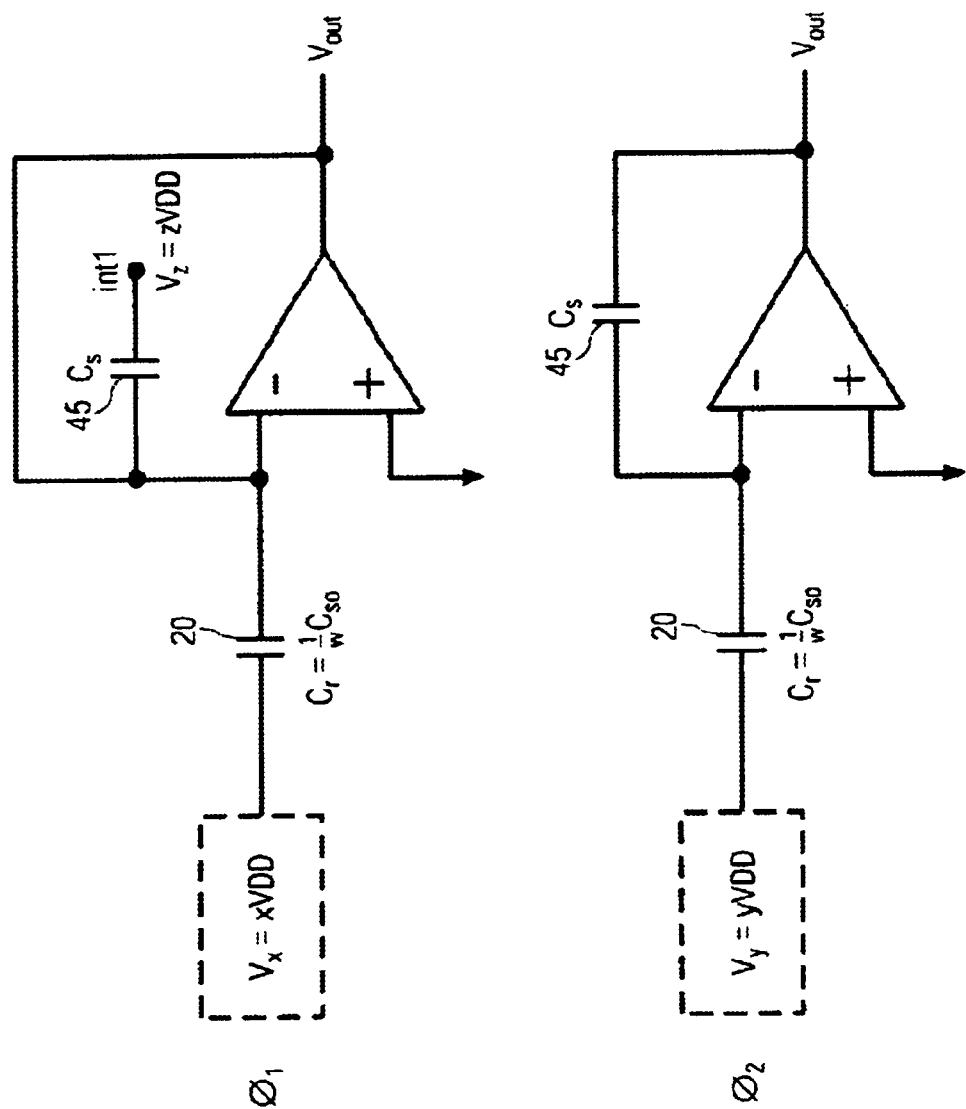
FIG. 2B is a breakdown of the circuit at each phase in accordance with one embodiment of the present invention.

FIG. 2B is a breakdown schematic of the circuit during each phase of operation.

The capacitance of capacitor $C_r$ can be represented by the following equation:

$$C_r = (C_{so})/w$$

where w is the ratio of the reference capacitance $C_r$ to the sensor capacitance $C_{so}$.

The operation of the circuit is now generally described. The charge at the inverting node of the operational amplifier 10 when the signal is high can be represented by:

$$Q_1 = C_r(0-V_x) + C_s(0-V_z)$$

When the clock signal is low, the charge at the inverting node of the operational amplifier 10 can be represented by:

$$Q_2 = C_r(0-V_y) + C_s(0-Vout)$$

$$Q_1 = Q_2$$

$$-(C_r \cdot V_x) - (C_s \cdot V_z) = -(C_r \cdot V_y) - (C_s \cdot Vout)$$

$$C_s \cdot Vout = C_r(V_x - V_y) + (V_z \cdot C_s)$$

$$C_s \cdot Vout = C_r \cdot VDD(x-y) + C_s \cdot z \cdot VDD$$

where x, y and z represent the amount of voltages that is asserted on each of the corresponding nodes of the circuit. For example, $x=+\frac{1}{2} \cdot VDD$ is the most positive supply voltage supplied to the chip, while $x=-\frac{1}{2} \cdot VDD$ is the most negative supply voltage supplied to the chip.

$$Vout = C_r \cdot VDD/C_s((x-y) + (C_s \cdot z)/C_r)$$

Assuming an increase in the capacitor gap $\Delta d$:

$$Vout = VDD/(w \cdot d) \cdot (((x-y) + w \cdot z) \cdot d + (x-y) \cdot \Delta d)$$

The term $(x-y)+w \cdot z$ must be equal to zero in order for Vout to be directly proportional to $9\Delta d$. By suitable selection of values for voltages $V_x$, $V_y$ and $V_z$, this term can be made equal to zero, e.g., where w=2, x=-½, y=--½ and z=-½.

$$Gain = VDD(x-y)/(w \cdot d)$$

Figure 3:
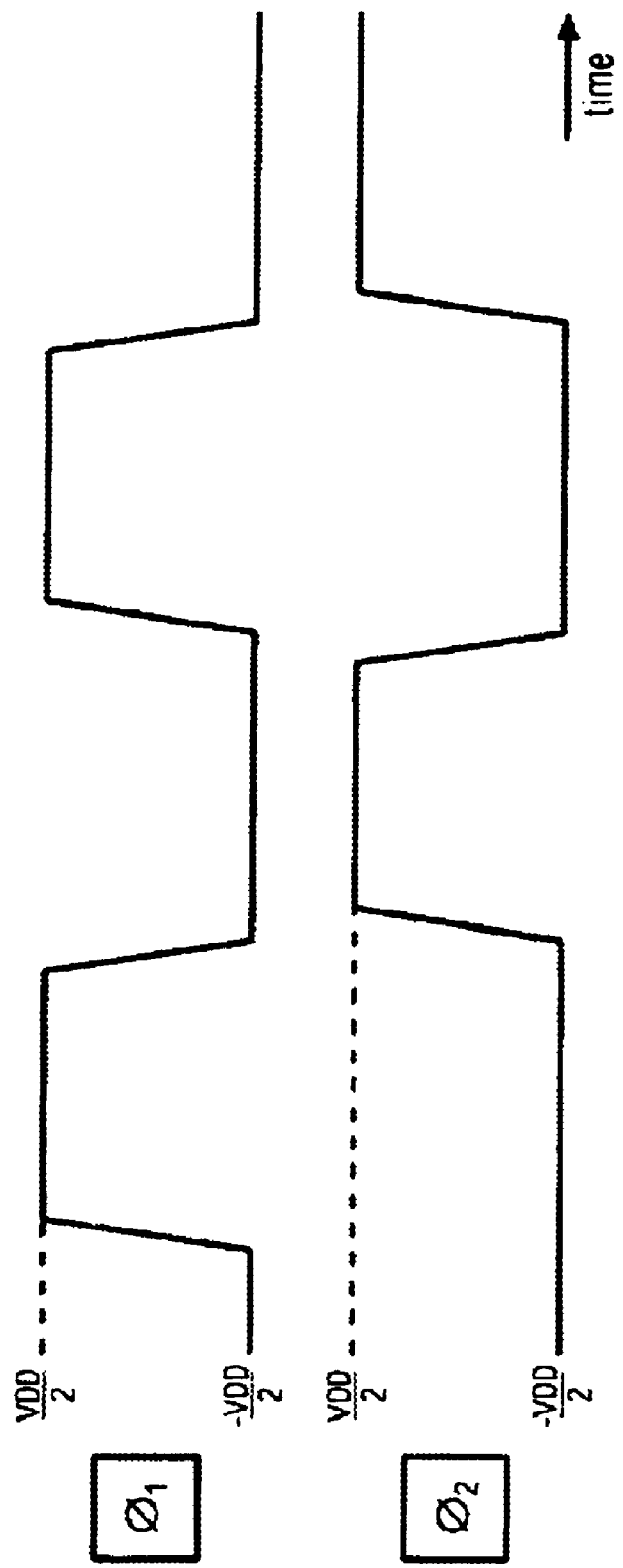
FIG. 3 is a schematic diagram of clock signal waveforms to be applied to the circuitry of FIG. 2 in accordance with one embodiment of the present invention.

Referring now to FIG. 3, illustrated is a schematic diagram of clock signals to be applied to the circuitry of the present invention. The clock signal is illustrated by amplitude of the signal at each of its two phases versus time. The clock signals $\phi_1$ and $\phi_2$ may be developed by any suitable two-phase nonoverlapping clock apparatus, including circuitry.

Figure 4:
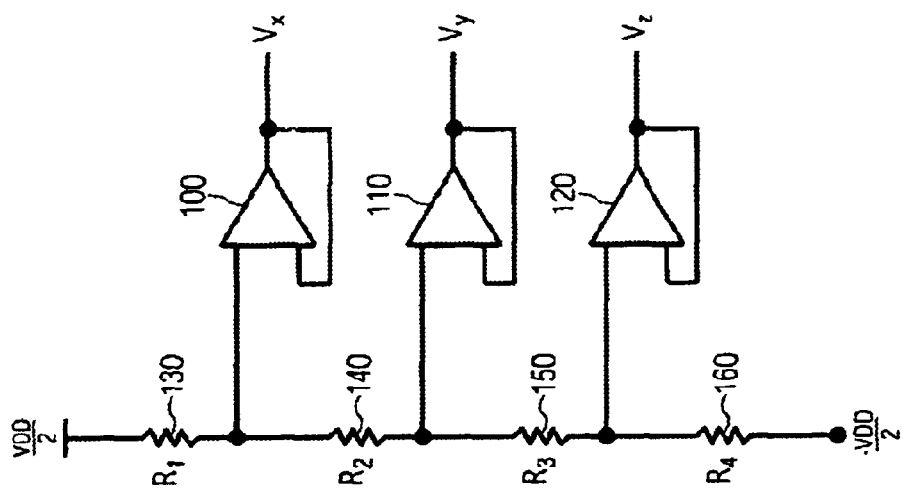
FIG. 4 is a schematic diagram of a circuit for one of the methods to generate bias voltages in accordance with one embodiment of the present invention.

Referring now to FIG. 4, illustrated is a schematic diagram of a circuit for generating bias voltages in accordance with one embodiment of the present invention. The circuit includes three operational amplifiers 100, 110, 120 and four resistors 130, 140, 150 and 160. Each of the amplifiers has an inverting input, a noninverting input and an output. The inverting input of each amplifier is coupled to the amplifier's output. The operational amplifiers 110, 120 and 130 are configured such that the noninverting input of each amplifier is connected to the junction between two resistors. Particularly, the noninverting input of the first operational amplifier 100 is coupled to the junction between resistors 130 and 140; the noninverting input of the second amplifier 110 is coupled to the junction between resistors 140 and 150; the noninverting input of the third amplifier 120 is coupled to the junction between 150 and 160. The voltages can also be separately generated with a voltage divider and unity gain buffer. The configuration shown in FIG. 4 includes one resistor string and multiple unity gain buffers. This configuration, as opposed to using a voltage divider and unity gain buffer, enables the circuit to be used with less power and without using multiple resistor strings.

Figure 5:
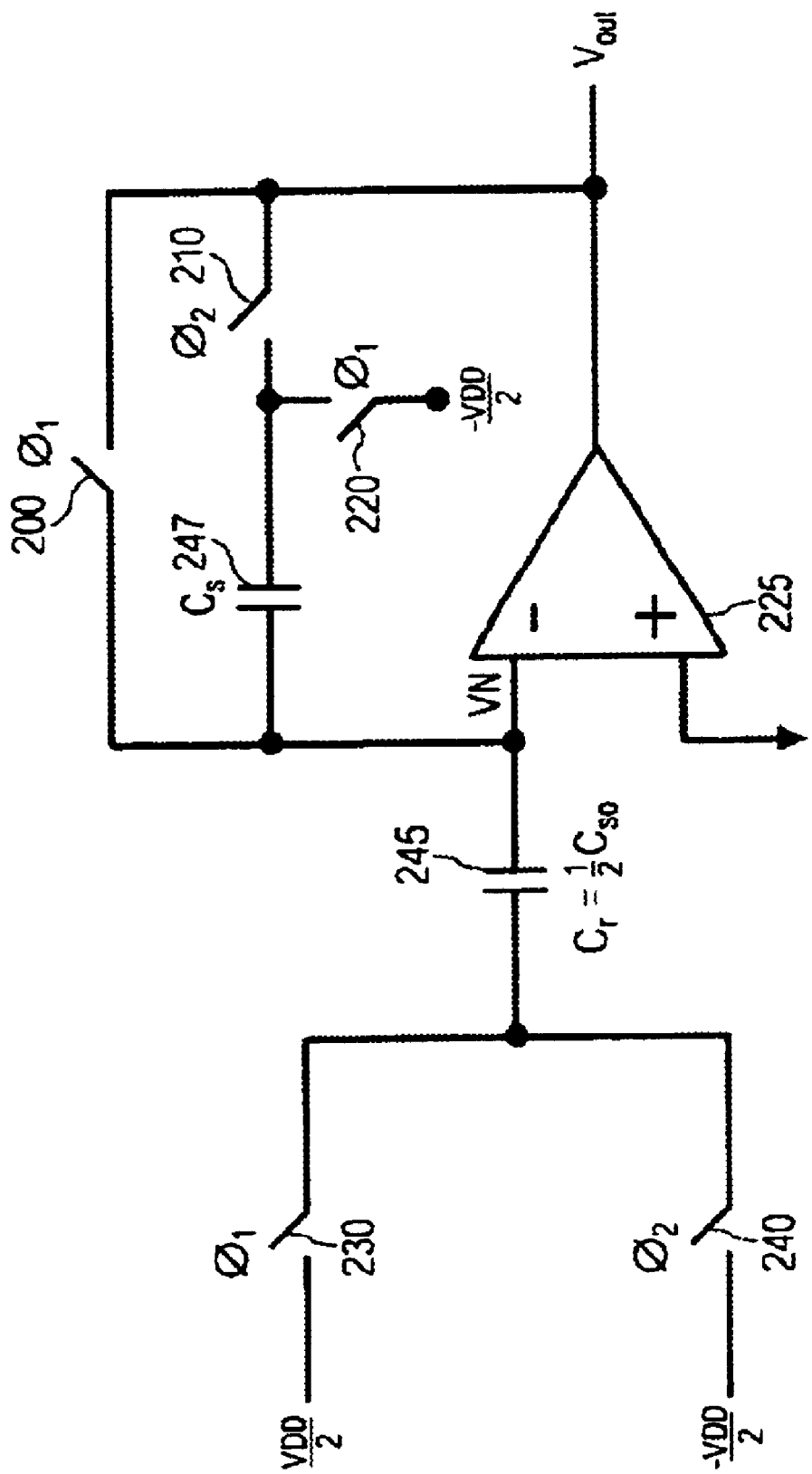
FIG. 5 is a schematic diagram of a minimally complex capacitive sensor circuit in accordance with one embodiment of the present invention.

Referring now to FIG. 5, illustrated is a schematic diagram of a minimally complex capacitive sensor circuit in accordance with one embodiment of the present invention. This circuit is representative of when w=2, x=½, y=-½, and z=-½. The circuit, just as the one shown in FIG. 2, is used to convert a measurable input variable to an electrical output signal (indicated as Vout). The values have been set such that $(x-y)+w \cdot z=0$. By selecting values for x, y, w and z, the voltage out becomes the same as capacitance, the voltage out is equal to the change in capacitor gap, e.g. when:

$$w=2, x=\tfrac{1}{2}, y=-\tfrac{1}{2}, z=-\tfrac{1}{2} \rightarrow$$

$$Vout = VDD/2 \cdot d((\tfrac{1}{2}-(-\tfrac{1}{2}) + 2 \cdot (-\tfrac{1}{2}) \cdot d + (\tfrac{1}{2}-(-\tfrac{1}{2}) \cdot \Delta d)$$

$$Vout = VDD \cdot \Delta d/(2 \cdot d)$$

$C_s$ 247 is independent of the parasitic capacitance and resistance at both terminals of the capacitor. The capacitor represented by $C_s$ 247 can be a micromachined capacitive sensor. For trimming purposes any of the variables w, x, y and z can be changed, e.g., through a digital to analog converter. Also, the variable w can be trimmed by including capacitors in parallel with capacitor $C_r$. Theoretically, $\Delta d$ can vary from -d to +d, limited by the output capability of operational amplifier 225.

In FIG. 5, the operational amplifier 225 is shown once again with an inverting input and a non-inverting input. The non-inverting input is coupled to ground. The inverting input is coupled to the capacitance $C_s$ 247 and to a reference capacitor $C_r$ 245. Changes in the measured variable result in changes to the capacitance $C_s$ 247. In this embodiment, the reference capacitance is equal to ½ the original sensor capacitance value. The supply voltages are either positive or negative, but quantitatively equivalent to ½ the voltage VDD.

The switches include a first switch 200, a second switch 210, a third switch 220, a fourth switch 230 and fifth switch 240. In the first phase of the clock, switch 230 is closed to supply a substantially constant voltage to reference capacitor $C_s$ 245. Switch 220 closes such that a substantially constant negative supply voltage (-VDD/2) is supplied through capacitor $C_s$ 247. Switch 200 closes such that a loop is formed from the inverting input of amplifier 225 and the output of amplifier 225.

In the second phase of the clock, switch 240 is closed to supply a substantially constant supply voltage (-VDD/2) to capacitor $C_r$. Switch 210 closes so that capacitor $C_s$ 247 is coupled between the inverting input of the operational amplifier 225 and the output of amplifier 225.

Figure 6A:
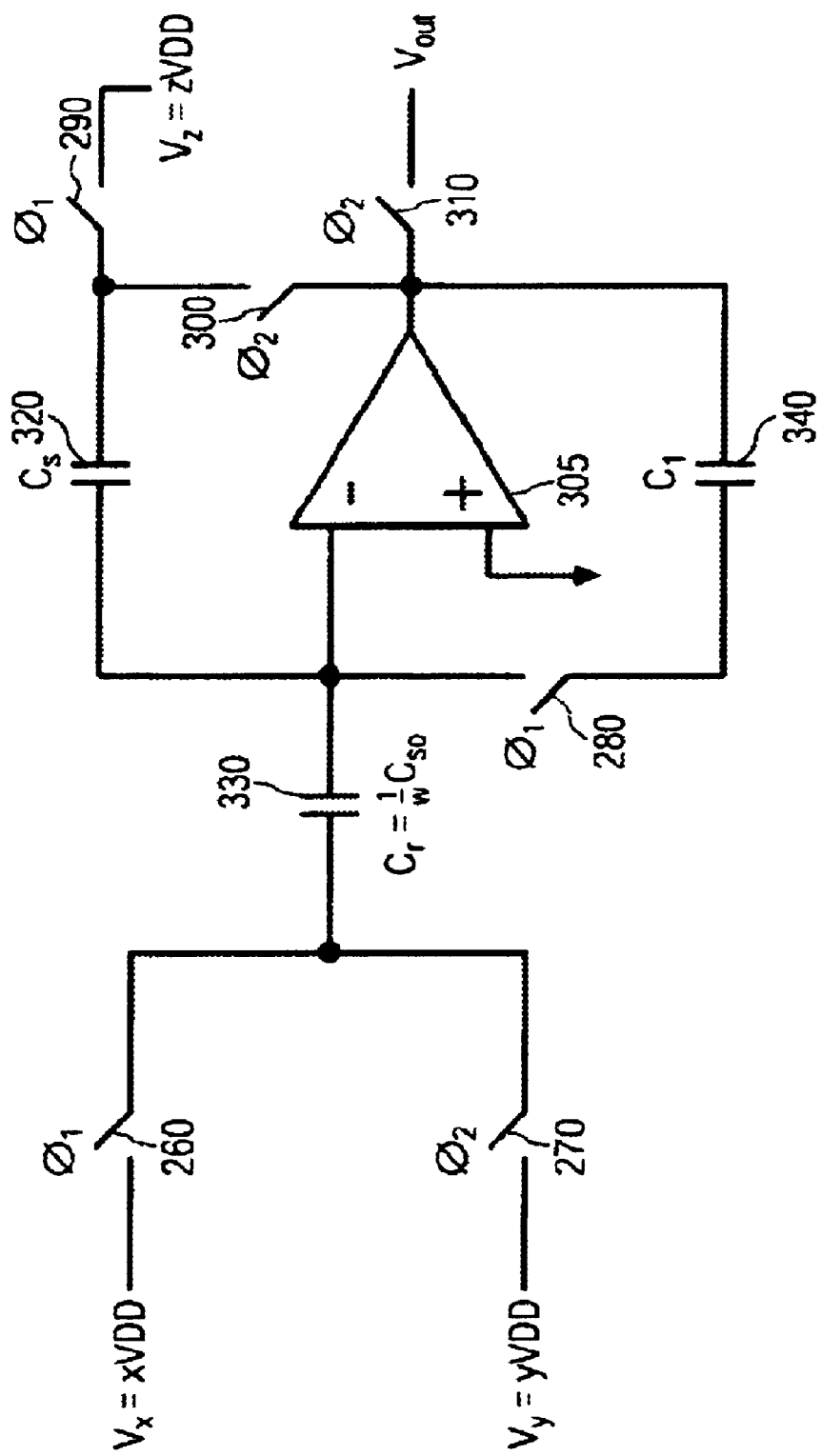
FIG. 6A is a circuit diagram illustration of a capacitive sensor circuit with improved gain compensation for the operational amplifier in accordance with another embodiment of the present invention.

Referring now to FIG. 6A, illustrated is yet another embodiment of the capacitive sensor circuit. This embodiment of the circuit provides improved gain compensation for the operational amplifier 305. Illustrated is an operational amplifier 305 with its noninverting input coupled to a reference capacitor $C_r$ 330.

Four switches 280, 290, 300, 310 are shown to the right of the reference capacitor $C_r$ in the circuit. Two switches 260, 270 are shown to the left of reference capacitor $C_r$. The six switches are controlled by a two-phase nonoverlapping clock. When the clock signal $\phi 1$ goes high, switch 260 closes such that a substantially constant voltage $V_x$ is applied to capacitor $C_r$ 330. Switch 290 closes such that a substantially constant voltage V.sub.z is applied to capacitor C.sub.s 320. Both capacitors C.sub.s 320 and C.sub.r 330 are operatively coupled to the inverting input of operational amplifier 305. Capacitor C.sub.s 320 can be a micromachined capacitive sensor. Switch 280 is closed during the high phase of the clock such that capacitor C.sub.1 340 is connected to both the inverting input of operational amplifier 305 and the output of operational amplifier 305.

When the clock signal .PHI. goes low, switch 270 closes such that a substantially constant voltage V.sub.y is applied to capacitor C.sub.r 330. Switch 300 closes at the low phase such that capacitor C.sub.s 320 is coupled to the inverting input of operational amplifier 305 and to the output of operational amplifier 305.

Figure 6B:
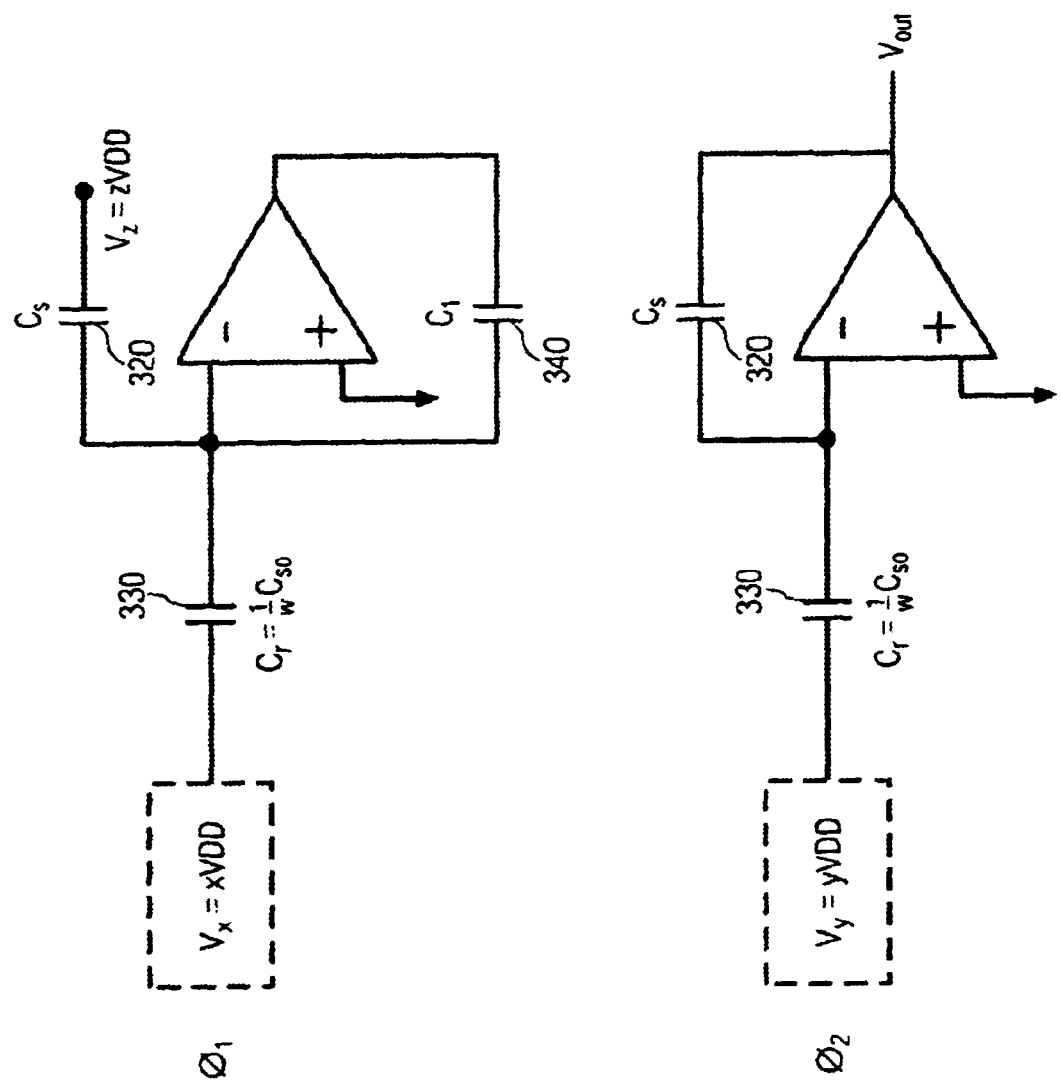
FIG. 6B is a breakdown for the circuit diagram illustration of a capacitive sensor circuit with improved gain compensation for the operational amplifier for each phase in accordance with another embodiment of the present invention.

FIG. 6B is a breakdown of the operation of the circuit for each phase.

Figure 7A:
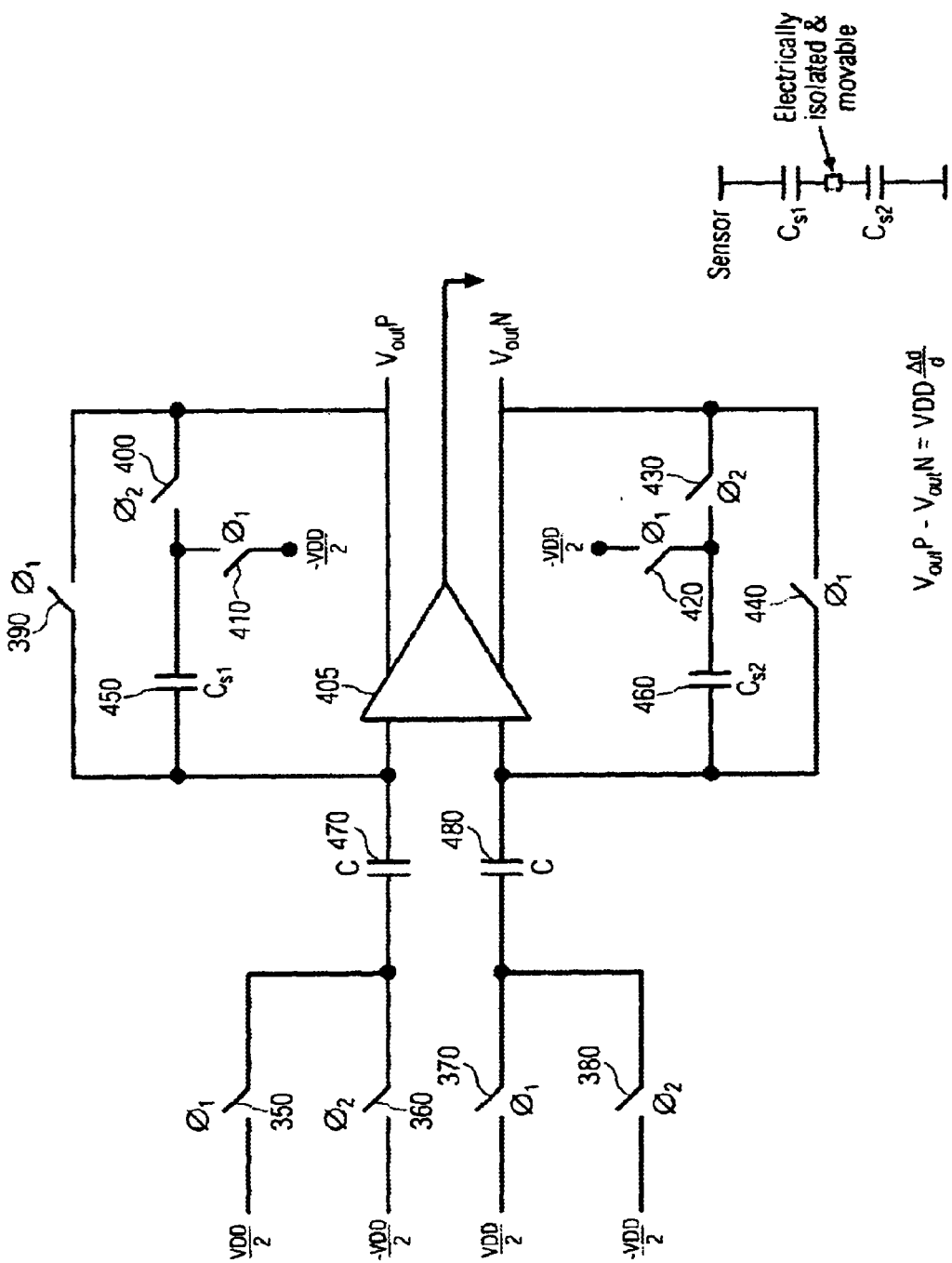
FIG. 7A is a fully differential implementation of a capacitive sensor circuit for measuring changes in a variable in accordance with another embodiment of the present invention.

Referring now to FIG. 7A, illustrated is a fully differential embodiment of the circuit of the present invention Illustrated are ten switches 350, 360, 370, 380, 390, 400, 410, 420, 430 and 440. This circuit is controlled by a two-phase nonoverlapping clock. When the clock signal .PHI.1 goes high, switches 350, 390, 410, 370, 420 and 440 are closed. When switch 350 is closed, a substantially constant voltage (+VDD/2) is supplied to capacitor C 470. In the first phase, i.e., when the clock signal goes high, switch 390 closes such that a loop is formed from the capacitor C 470 to the noninverting output of operational amplifier 405. Amplifier 405 is a fully differential operational amplifier with an embedded output common-mode feedback (CMFB) circuit. Capacitor C 470 is operatively coupled to the inverting input of operational amplifier 405. In this first clock phase, switch 410 closes such that a substantially constant negative supply voltage (−VDD/2) is supplied to capacitor C.sub.s1 450 which is coupled between the inverting input of operational amplifier 405 and the noninverting output of operational amplifier 405. The resulting voltage that is output from the noninverting output is represented as VoutP. Also, in this first phase of the clock, switch 370 closes such that a substantially constant positive voltage (VDD/2) is supplied to capacitor C 480 which is coupled to the noninverting input of operational amplifier 405. Coupled between the noninverting input and the inverting output is capacitor C.sub.s2 which is supplied with negative substantially constant voltage (−VDD/2) when switch 420 closes in the first clock phase. The voltage that is output from the inverting output of operational amplifier 405 is VoutN. In this fully differential embodiment, the outputs VoutP and VoutN are in proportion to the differences between voltages applied to its inputs.

In the second phase of the clock, switches 350, 370, 390, 410, 420 and 440 are open, and switches 360, 380, 400 and 430 are closed. When switch 360 closes, a substantially constant voltage is supplied to capacitor C 470 which is coupled to the inverting input of operational amplifier 405. When switch 400 closes, a substantially constant voltage is supplied to capacitor C.sub.s1 450 which is in turn coupled to the noninverting output of amplifier 405. The resulting output voltage is represented by VoutP. When switch 380 closes, a substantially constant negative supply voltage is supplied to capacitor C 480. Capacitor C 480 is coupled to the noninverting input of operational amplifier 405. Capacitor C.sub.s2 460 is coupled between the noninverting input terminal of operational amplifier 405 and the inverting output terminal of operational amplifier 405. The resulting output voltage is VoutN.

In this embodiment the capacitor C.sub.s1 450 and C.sub.s2 460 are electrically insulated from each other. In other words, C.sub.s1 450 and C.sub.s2 should not share the same electrical node in this circuit configuration. The circuit should allow for independent voltages to be applied to both terminals of C.sub.s1 and C.sub.s2 so that there is no short circuit. Capacitors C.sub.s1 450 and C.sub.s2 460 can be micromachined capacitive sensors.

When the sensor capacitor C.sub.s1 increases the gap by .DELTA.d ($\Delta d$) and the sensor capacitor C.sub.s2 decreases the gap by .DELTA.d ($\Delta d$) accordingly, by going through similar mathematical manipulations, the difference between VoutP and VoutN can be represented by:

$$VoutP-VoutN=\Delta d/d*VDD$$

The formula is based on the assumption that the plates are electrically insulated from each other.

Figure 7B:
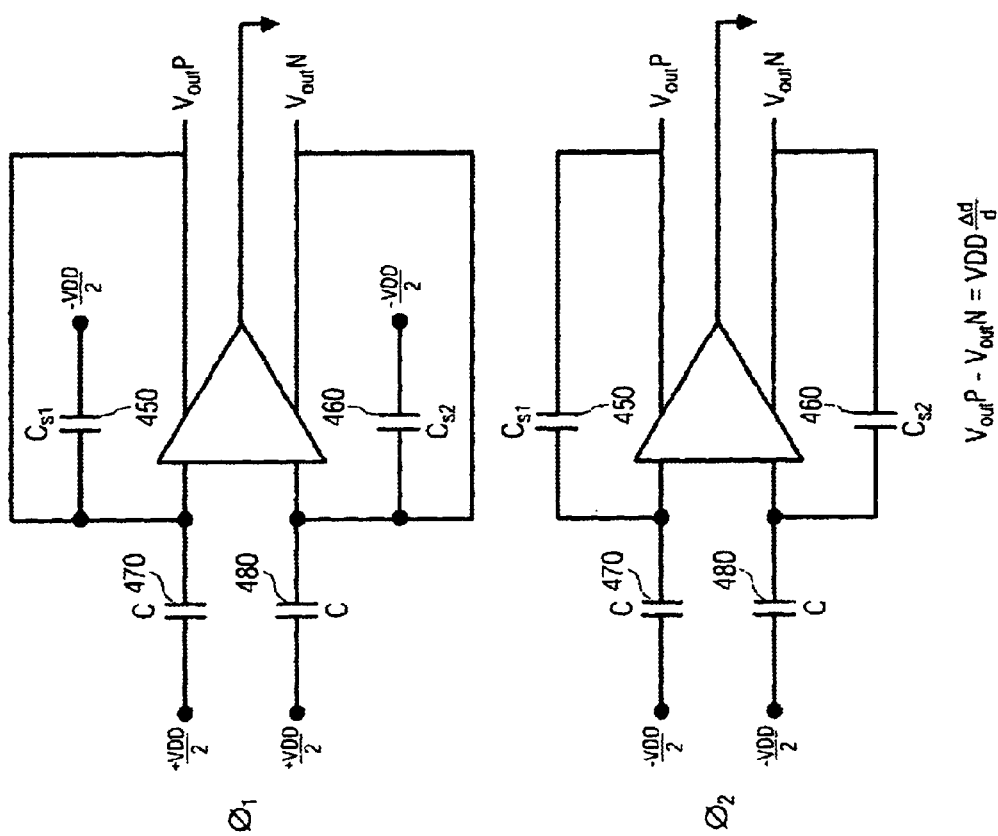
FIG. 7B is a breakdown of the circuit at each phase in accordance with another embodiment of the present invention.

FIG. 7B is a breakdown of the circuit shown in FIG. 7A according to each phase of the clock.

Figure 8:
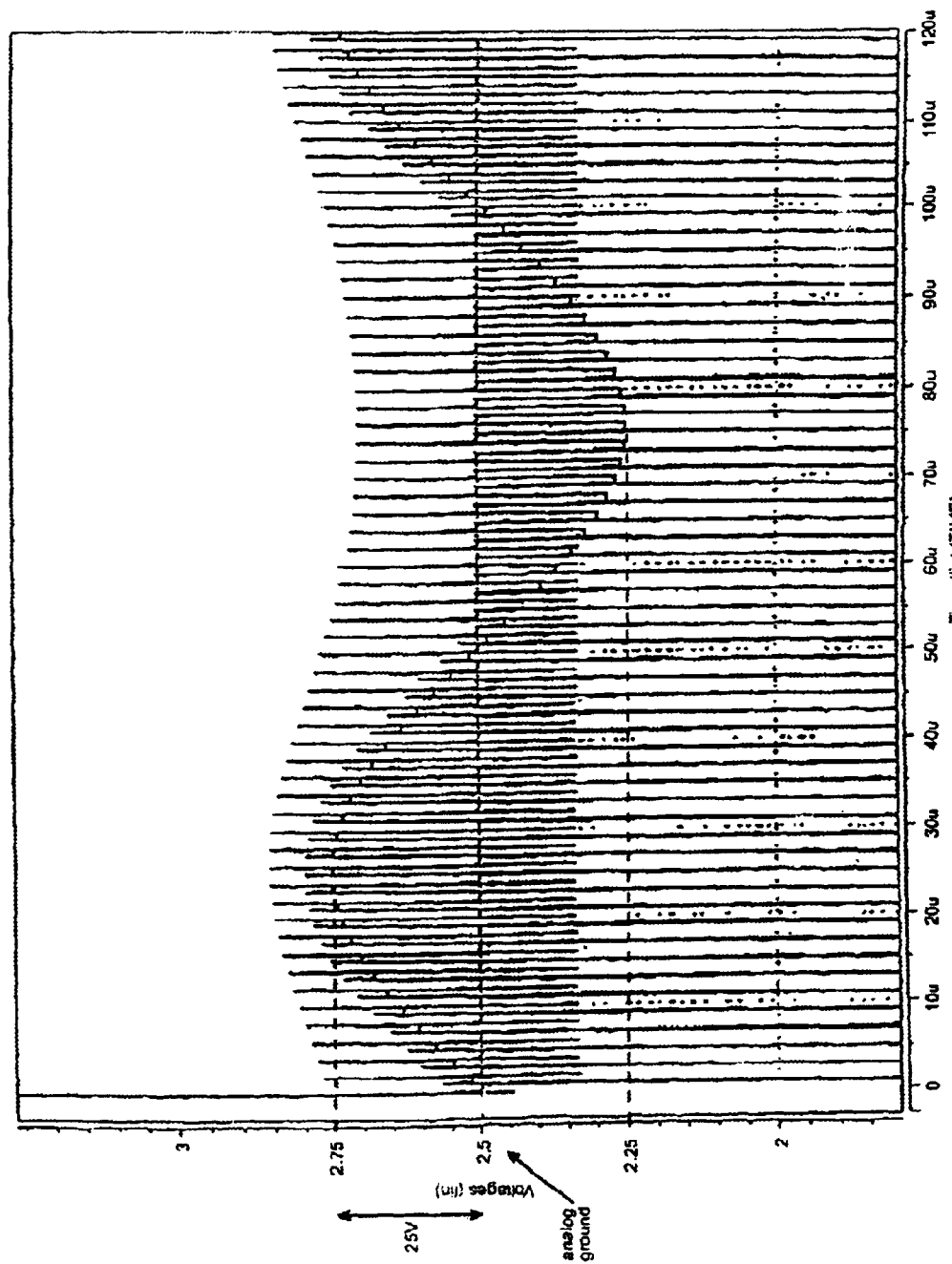
FIG. 8 is a graph of voltage (Vout) versus time when the gap of sensor capacitance varies sinusoidally at 10 kHz with a plus or minus 10% peak and 2.5 V is the analog ground.

Referring now to FIG. 8, illustrated is a graph of voltage Vout versus time when the gap of sensor capacitance varies at 10 kHz with a plus or minus 10% peak when 2.5 V is the analog ground. When the change in gap ($\Delta d$) occurs at a frequency of 10 kHz and is varied sinusoidally, the change in gap can be represented mathematically as follows:

$$\Delta d = 0.1*\sin[z2*\pi*f]$$

The following output is obtained:

$$Vout=VDD*\Delta d/(2*d)$$

When 2.5 V is the analog ground, the output should be 2.5 V+0.25 V=2.75 V. The peak of the output is shown on the graph. The output varies as follows:

$$Vout=0.25*\sin(2*\pi*(10 \text{ kHz})) \text{ volts}$$

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A capacitive sensor circuit for measuring changes in a variable that can be measured according to changes in capacitor gap, the circuit comprising:

an operational amplifier including an inverting input terminal, a noninverting input terminal, and an output terminal, wherein said noninverting input terminal is operatively coupled to ground;

a first capacitor coupled to said inverting input of said operational amplifier, wherein the first capacitor is a reference capacitor;

a second capacitor coupled between the inverting input terminal and the output terminal of said operational amplifier, wherein said second capacitor is a sensor capacitor and wherein a reference node is connected to said second capacitor;

a timing device, said timing device having two phases, said two phases including a first phase and a second phase, wherein the two phases are nonoverlapping phases;

a plurality of switching devices, wherein said switching devices include a first group of switches and a second group of switches, wherein each group of said switches are responsive to a phase of said timing device, wherein said first group of switches closes during a first phase of said timing device and said second group of switches closes during a second phase of said timing device;

a plurality of voltage generating devices, wherein each of said voltage generating devices is operatively coupled to the circuit via a switch thereby generating a substantially constant voltage to the circuit;

wherein during the first phase of the clock, a first substantially constant reference voltage is supplied to the first capacitor via a first switch, and a second substantially constant reference voltage is supplied via a second switch to the reference node operatively connected to said second capacitor, thereby canceling DC offset voltage;

wherein during the second phase of the clock, a third substantially constant reference voltage is supplied via a third switch to the first capacitor; and wherein the first operational amplifier includes one amplifier stage;

such that the electrical signal output from the output terminal of the operational amplifier is substantially linearly proportional to a change in a variable measurable by change in a capacitor gap.

2. The circuit of claim 1 wherein the variable measurable by a change in a capacitor gap is pressure.

3. The circuit of claim 1 wherein the variable measurable by a change in a capacitor gap is acceleration.

4. The circuit of claim 1 wherein a voltage generating device is a bias circuit for generating bias voltages.

5. The circuit of claim 4 wherein the bias circuit includes four resistors being a first resistor, a second resistor, a third resistor and a fourth resistor, and three operational amplifiers being a second operational amplifier, a third operational amplifier, and a fourth operational amplifier and wherein the second operational amplifier is coupled to a junction between the first and second resistors, wherein the third operational amplifier is coupled to a junction between the second and third resistors, wherein the fourth operational amplifier is coupled to a junction between the third and fourth resistors, wherein the resistors are coupled in series to each other in order of the first resistor, the second resistor, the third resistor and the fourth resistor.

6. The circuit of claim 1 wherein the timing device is a two-phase nonoverlapping clock.

7. The circuit of claim 1 wherein voltage is the electrical signal output from the output terminal of the operational amplifier that is correlated to a change in a variable measurable by change in a capacitor gap.

8. The circuit of claim 1 wherein the substantially constant supply voltages generated by the voltage generating devices are trimmed to account for variations in capacitance for said second capacitor.

9. The circuit of claim 1 wherein a ratio of the sensor capacitance prior to a change in capacitor gap and the capacitance of the reference capacitor is trimmed to account for variations in capacitance for said second capacitor.

10. The circuit of claim 1, further comprising:
a third capacitor coupled, in said first phase, in a feedback loop from the inverting input of said operational amplifier and the output of said operational amplifier.

11. A capacitive sensor circuit for measuring changes in a variable that can be measured according to changes in capacitor gap, the circuit comprising:
an operational amplifier including an inverting input terminal, a noninverting input terminal, and an output terminal, wherein said noninverting input terminal is operatively coupled to ground;

a first capacitor coupled to said inverting input of said operational amplifier, wherein the first capacitor is a reference capacitor;

a second capacitor coupled between the inverting input terminal and the output terminal of said operational amplifier, wherein said second capacitor is a sensor capacitor and wherein a reference node is connected to said second capacitor;

a timing device, said timing device having two phases, said two phases including a first phase and a second phase, wherein the two phases are nonoverlapping phases;

a plurality of switching devices, wherein said switching devices include a first group of switches and a second group of switches, wherein each group of said switches are responsive to a phase of said timing device, wherein said first group of switches closes during a first phase of said timing device and said second group of switches closes during a second phase of said timing device;

a plurality of voltage generating devices, wherein each of said voltage generating devices is operatively coupled to the circuit via a switch thereby generating a substantially constant voltage to the circuit;

wherein during the first phase of the clock, a first substantially constant reference voltage is supplied to the first capacitor via a first switch, and a second substantially constant reference voltage is supplied via a second witch to the reference node operatively coupled to said second capacitor, thereby canceling DC offset voltage;

wherein during the second phase of the clock, a third substantially constant reference voltage is supplied via a third switch to the first capacitor; and wherein the operational amplifier includes one amplifier stage;

such that the electrical signal output from the output terminal of the operational amplifier is correlated to a change in a variable measurable by change in a capacitor gap; and wherein a voltage generating device is a bias circuit for generating bias voltages, and the voltage generating devices include at least one voltage divider and a unity gain buffer.

12. A capacitive sensor circuit for measuring changes in a variable that can be measured according to changes in capacitor gap, the circuit comprising:
an operational amplifier including an inverting input terminal, a noninverting input terminal, and an output terminal, wherein said noninverting input terminal is operatively coupled to ground;

a first capacitor coupled to said inverting input of said operational amplifier, wherein the first capacitor is a reference capacitor;

a second capacitor coupled between the inverting input terminal and the output terminal of said operational amplifier, wherein said second capacitor is a sensor capacitor and wherein a reference node is connected to said second capacitor;

a timing device, said timing device having two phases, said two phases including a first phase and a second phase, wherein the two phases are nonoverlapping phases;

a plurality of switching devices, wherein said switching devices include a first group of switches and a second group of switches, wherein each group of said switches are responsive to a phase of said timing device, wherein said first group of switches closes during a first phase of said timing device and said second group of switches closes during a second phase of said timing device;

a plurality of voltage generating devices, wherein each of said voltage generating devices is operatively coupled to the circuit via a switch thereby generating a substantially constant voltage to the circuit;

wherein during the first phase of the clock, a first substantially constant reference voltage is supplied to the first capacitor via a first switch, and a second substantially constant reference voltage is supplied via a second switch to the reference node operatively coupled to said second capacitor, thereby canceling DC offset voltage;

wherein during the second phase of the clock, a third substantially constant reference voltage is supplied via a third switch to the first capacitor; and wherein the operational amplifier includes one amplifier stage;

such that the electrical signal output from the output terminal of the operational amplifier is correlated to a change in a variable measurable by change in a capacitor gap, and wherein the substantially constant supply voltages generated by the voltage generating devices are trimmed to account for variations in capacitance for said second capacitor and the circuit further includes a digital to analog converter that generates a digital to analog converter voltage for trimming substantially constant supply voltages.

13. A fully differential capacitive sensor circuit for measuring changes in a variable measurable by changes in capacitor gap, the circuit comprising:

an operational amplifier including an inverting input terminal, a noninverting input terminal, an inverting output terminal, a noninverting output terminal, and a third output terminal, wherein said third output terminal is operatively coupled to ground;

a first capacitor coupled to said inverting input of said operational amplifier, wherein the first capacitor is a reference capacitor;

a second capacitor coupled in series to the inverting input terminal and the noninverting output terminal of said operational amplifier, wherein said second capacitor is a sensor capacitor wherein a reference node is connected to said second capacitor, wherein said first capacitor is a reference for said second capacitor;

a third capacitor coupled to said noninverting input of said first operational amplifier, wherein said third capacitor is a reference capacitor;

a fourth capacitor coupled in series to the noninverting input of said first operational amplifier and the inverting output terminal of said operational amplifier, wherein said fourth capacitor is a sensor capacitor and wherein said third capacitor is a reference capacitor for said fourth capacitor, and wherein a second reference node is connected to said fourth capacitor;

a timing device, said timing device having two phases, said two phases including a first phase and a second phase;

a plurality of switching devices, wherein said switching devices include a first group of switches and a second group of switches, wherein each group of said switches are responsive to a phase of said timing device, wherein said first group of switches closes during a first phase of said timing device and said second group of switches closes during a second phase of said timing device;

a plurality of voltage generating devices, wherein each of said voltage generating devices is operatively coupled to the circuit via a switch thereby generating a substantially constant voltage to the circuit;

insulating device for insulating the second capacitor from the fourth capacitor;

wherein during the first phase of the clock, a first substantially constant reference voltage is supplied via a first switch to the first capacitor, a second substantially constant reference voltage is supplied via a second switch to the second capacitor, and a third substantially constant reference voltage is supplied via a third switch to the third capacitor and a fourth substantially constant voltage is supplied via a fourth switch to the fourth capacitor, wherein the first and third substantially constant reference voltages are positive and said second and fourth substantially constant reference voltages are negative, and said second substantially constant voltage is supplied via said second switch to the reference node operatively connected to said second capacitor, thereby canceling DC offset voltage, and wherein said fourth substantially constant voltage is supplied via said fourth switch to said second reference node operatively connected to said fourth capacitor, thereby canceling DC offset voltage and wherein the second and fourth substantially constant voltages are negative;

wherein during a second phase of the clock, a fifth substantially constant reference voltage is supplied via a fifth switch to the first capacitor, and a sixth substantially constant reference voltage is supplied via a third switch to the third capacitor, wherein the fifth and sixth substantially constant reference voltages are negative; and wherein the first operational amplifier includes one amplifier stage;

such that the electrical signal output from the inverting output terminal of the operational amplifier and the electrical signal output from the noninverting output terminal of the operational amplifier are correlated to a change in a variable measurable by change in a capacitor gap.

14. The circuit of claim 13 wherein the variable measurable by a change in a capacitor gap is pressure.

15. The circuit of claim 13 wherein the variable measurable by a change in a capacitor gap is acceleration.

16. The circuit of claim 13 wherein a voltage generating device is a bias circuit for generating bias voltages.

17. The circuit of claim 16 wherein the bias circuit includes four resistors being a first resistor, a second resistor, a third resistor and a fourth resistor, and three operational amplifiers being a second operational amplifier, a third operational amplifier, and a fourth operational amplifier and wherein the second operational amplifier is coupled to a junction between the first and second resistors, wherein the third operational amplifier is coupled to a junction between the second and third resistors, wherein the fourth operational amplifier is coupled to a junction between the third and fourth resistors, wherein the resistors are coupled in series to each other in order of the first resistor, the second resistor, the third resistor and the fourth resistor.

18. The circuit of claim 16 wherein the voltage generating devices include at least one voltage divider and a unity gain buffer.

19. The circuit of claim 13 wherein the timing device is a two-phase nonoverlapping clock.

20. The circuit of claim 13 wherein voltage is the electrical signal output from the inverting output terminal of the operational amplifier and the noninverting output of the operational amplifier, and the voltages are correlated to a change in a variable measurable by change in a capacitor gap.

21. The circuit of claim 13 wherein the substantially constant supply voltages generated by the voltage generating devices are trimmed to account for variations in capacitance for said second capacitor.

22. The circuit of claim 21 wherein the circuit further includes a digital to analog converter that generates a digital to analog converter voltage for trimming substantially constant supply voltages.

23. The circuit of claim 13 wherein a ratio of the sensor capacitance prior to a change in capacitor gap and the capacitance of the reference capacitor is trimmed to account for variations in capacitance for said second capacitor.

* * * * *